(12) United States Patent
Parker et al.

(10) Patent No.: US 10,965,369 B2
(45) Date of Patent: *Mar. 30, 2021

(54) NORMAL INCIDENCE PHOTODETECTOR WITH SELF-TEST FUNCTIONALITY

(71) Applicant: Juniper Networks, Inc., Sunnyvale, CA (US)

(72) Inventors: John Parker, Goleta, CA (US); Brian Robert Koch, Brisbane, CA (US); Gregory Alan Fish, Santa Barbara, CA (US); Hyundai Park, Goleta, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/854,012

(22) Filed: Apr. 21, 2020

(65) Prior Publication Data

US 2020/0252126 A1    Aug. 6, 2020

Related U.S. Application Data

(63) Continuation of application No. 16/197,041, filed on Nov. 20, 2018, now Pat. No. 10,666,353.

(51) Int. Cl.
*H04B 10/077* (2013.01)
*G02B 6/12* (2006.01)
(Continued)

(52) U.S. Cl.
CPC ..... *H04B 10/0775* (2013.01); *G02B 6/12004* (2013.01); *H01L 31/02327* (2013.01);
(Continued)

(58) Field of Classification Search
CPC ........... G02B 2006/12061; G02B 2006/12078; G02B 2006/121; G02B 2006/12121;
(Continued)

(56) References Cited

U.S. PATENT DOCUMENTS

| 5,248,635 A | 9/1993 | Bouayad-amine et al. |
| 5,689,122 A | 11/1997 | Chandrasekhar |

(Continued)

FOREIGN PATENT DOCUMENTS

| CN | 101989630 | 3/2011 |
| CN | 105122469 | 12/2015 |

(Continued)

OTHER PUBLICATIONS

Baribeau et al ; Ge dots and nanostructures grown epitaxially on Si; Feb. 2006; Journal of Physics: Condensed matter, Feb. 2006. (Year: 2006).*

(Continued)

*Primary Examiner* — Amritbir K Sandhu
(74) *Attorney, Agent, or Firm* — Schwegman Lundberg & Woessner, P.A.

(57) ABSTRACT

Photonically integrated normal incidence photodetectors (NIPDs) and associated in-plane waveguide structures optically coupled to the NIPDs can be configured to allow for both in-plane and normal-incidence detection. In photonic circuits with light-generation capabilities, such as integrated optical transceivers, the ability of the NIPDs to detect in-plane light is used, in accordance with some embodiments, to provide self-test functionality.

20 Claims, 7 Drawing Sheets

(51) Int. Cl.
*H01L 31/0224* (2006.01)
*H01L 31/0232* (2014.01)
*H01L 31/0304* (2006.01)
*H01L 31/0352* (2006.01)
*H01L 31/105* (2006.01)
*H04B 10/40* (2013.01)

(52) U.S. Cl.
CPC .. *H01L 31/022416* (2013.01); *H01L 31/0304* (2013.01); *H01L 31/0352* (2013.01); *H01L 31/105* (2013.01); *G02B 2006/121* (2013.01); *G02B 2006/1215* (2013.01); *G02B 2006/12061* (2013.01); *G02B 2006/12078* (2013.01); *G02B 2006/12121* (2013.01); *G02B 2006/12123* (2013.01); *G02B 2006/12145* (2013.01); *G02B 2006/12164* (2013.01); *H04B 10/40* (2013.01)

(58) Field of Classification Search
CPC ........... G02B 2006/12123; G02B 2006/12145; G02B 2006/1215; G02B 2006/12164; G02B 6/12004; G02B 6/4214; G02B 6/4215; G02B 6/4286; H01L 31/022416; H01L 31/02327; H01L 31/0304; H01L 31/0352; H01L 31/105; H04B 10/0731; H04B 10/0775; H04B 10/40
USPC .................................................. 398/202–214
See application file for complete search history.

(56) References Cited

U.S. PATENT DOCUMENTS

| | | | |
|---|---|---|---|
| 7,167,606 B2 | 1/2007 | Gunn, III et al. | |
| 9,166,678 B1* | 10/2015 | Fish ....................... | H04B 10/00 |
| 9,391,225 B1 | 7/2016 | Davids et al. | |
| 9,960,297 B2* | 5/2018 | Norberg ............ | H01L 31/02327 |
| 10,488,605 B1* | 11/2019 | Budd ................... | G02B 6/4204 |
| 10,651,110 B1* | 5/2020 | Norberg ................ | H01L 29/868 |
| 2002/0050622 A1* | 5/2002 | Takeuchi ............... | H01L 31/105 257/431 |
| 2002/0110329 A1* | 8/2002 | Schulz ................ | H01L 31/0232 385/49 |
| 2003/0089958 A1* | 5/2003 | Gutierrez-Aitken ......................... | H01L 31/03046 257/458 |
| 2004/0145025 A1* | 7/2004 | Yasuoka ................. | G02B 6/132 257/432 |
| 2005/0012030 A1* | 1/2005 | Mahajan ............... | H01L 31/105 250/214.1 |
| 2007/0104441 A1 | 5/2007 | Ahn et al. | |
| 2010/0074573 A1 | 3/2010 | Yoshikawa | |
| 2010/0181651 A1* | 7/2010 | Pan ....................... | H01L 31/105 257/623 |
| 2010/0301440 A1* | 12/2010 | Watanabe ........... | H01L 31/1844 257/436 |
| 2011/0024863 A1* | 2/2011 | Koi ....................... | H01L 31/107 257/438 |
| 2011/0042647 A1* | 2/2011 | Choi ............... | H01L 31/035236 257/21 |
| 2011/0286746 A1 | 11/2011 | Ji et al. | |
| 2011/0291213 A1* | 12/2011 | Yamamura ........ | H01L 31/02363 257/432 |
| 2012/0133013 A1* | 5/2012 | Koyama ......... | H01L 31/022416 257/434 |
| 2013/0272646 A1* | 10/2013 | Fish ....................... | G02B 6/305 385/14 |
| 2014/0043050 A1 | 2/2014 | Stone et al. | |
| 2014/0199064 A1* | 7/2014 | Yagisawa ............... | H04B 10/60 398/25 |
| 2015/0171957 A1 | 6/2015 | Featherston et al. | |
| 2015/0301180 A1* | 10/2015 | Stettner ................... | G01S 17/18 356/5.01 |
| 2015/0381273 A1 | 12/2015 | Gloeckner et al. | |
| 2016/0148959 A1* | 5/2016 | Cheng ................... | H01L 31/028 257/290 |
| 2016/0307939 A1 | 10/2016 | Wang et al. | |
| 2019/0101647 A1 | 4/2019 | Feshali et al. | |
| 2019/0109648 A1 | 4/2019 | Noguchi | |
| 2020/0162156 A1* | 5/2020 | Parker ................... | H01L 31/105 |

FOREIGN PATENT DOCUMENTS

| | | |
|---|---|---|
| CN | 106461987 | 2/2017 |
| EP | 2680464 A1 | 1/2014 |
| JP | 2015220290 | 12/2015 |

OTHER PUBLICATIONS

U.S. Appl. No. 16/197,041, filed Nov. 20, 2018, Normal Incidence Photodetector With Self-Test Functionality.
"U.S. Appl. No. 16/197,041, Advisory Action dated Feb. 28, 2020", 3 pgs.
"U.S. Appl. No. 16/197,041, Examiner Interview Summary dated Feb. 13, 2020", 3 pgs.
"U.S. Appl. No. 16/197,041, Examiner Interview Summary dated Dec. 10, 2019", 3 pgs.
"U.S. Appl. No. 16/197,041, Final Office Action dated Dec. 17, 2019", 21 pgs.
"U.S. Appl. No. 16/197,041, Non Final Office Action dated Sep. 3, 2019".
"U.S. Appl. No. 16/197,041, Notice of Allowance dated Mar. 25, 2020", 9 pgs.
"U.S. Appl. No. 16/197,041, Response filed Feb. 11, 2020 to Final Office Action dated Dec. 17, 2019", 9 pgs.
"U.S. Appl. No. 16/197,041, Response filed Mar. 2, 2020 to Advisory Action dated Feb. 28, 2020", 10 pgs.
"U.S. Appl. No. 16/197,041, Response filed Dec. 3, 2019 to Non Final Office Action dated Sep. 3, 2019", 9 pgs.
"European Application Serial No. 19179218.3, Extended European Search Report dated Jan. 8, 2020", 9 pgs.
Baribeau, J-M, et al., "Topical Review; Ge Dots and Nanostructures Grown Epitaxially on Si", Journal of Physics: Condensed Matter, Institute of Physics Publishing, Bristol, GB, vol. 18, No. 8, (Mar. 1, 2006), R139-R174.
Kurata, Yu, et al., "Fabrication of InP-PDs on Silica-Based PLC Using Heterogeneous Integration Technique", Journal of Lightwave Technology, IEEE, USA, vol. 32, No. 16, (Aug. 15, 2014), 2841-2848.
"Chinese Application Serial No. 2010576406.7, Voluntary Amendment filed Sep. 16, 2020", w English Claims, 16 pgs.
"Korean Application Serial No. 10-2019-0077659, Notice of Preliminary Rejection dated Jan. 22, 2021", w English Translation, 8 pgs.
"Chinese Application Serial No. 201910576406.7, Office Action dated Jan. 25, 2021", w Concise Statement of Relevance, 9 pgs.

* cited by examiner

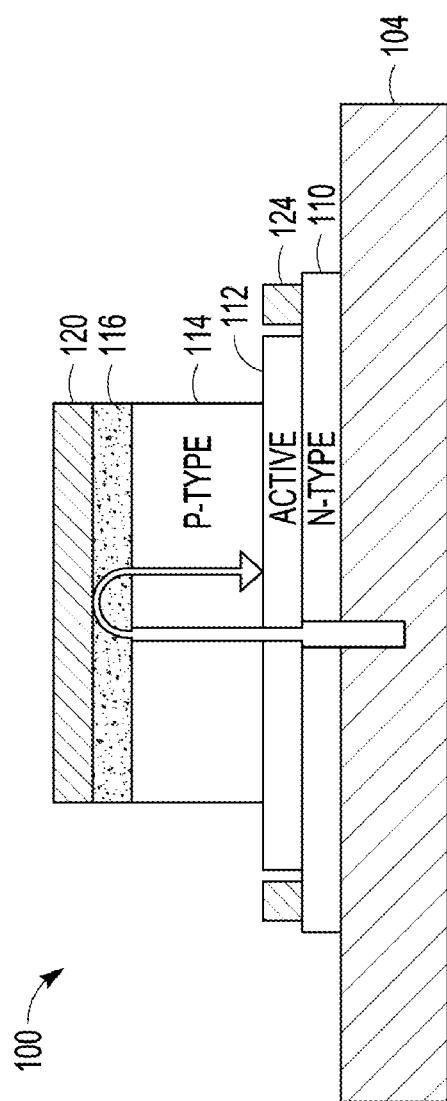
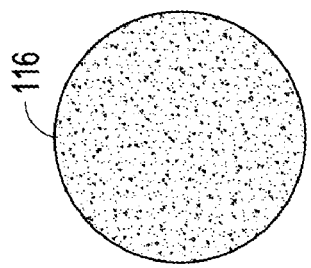
FIG. 1A
FIG. 1B
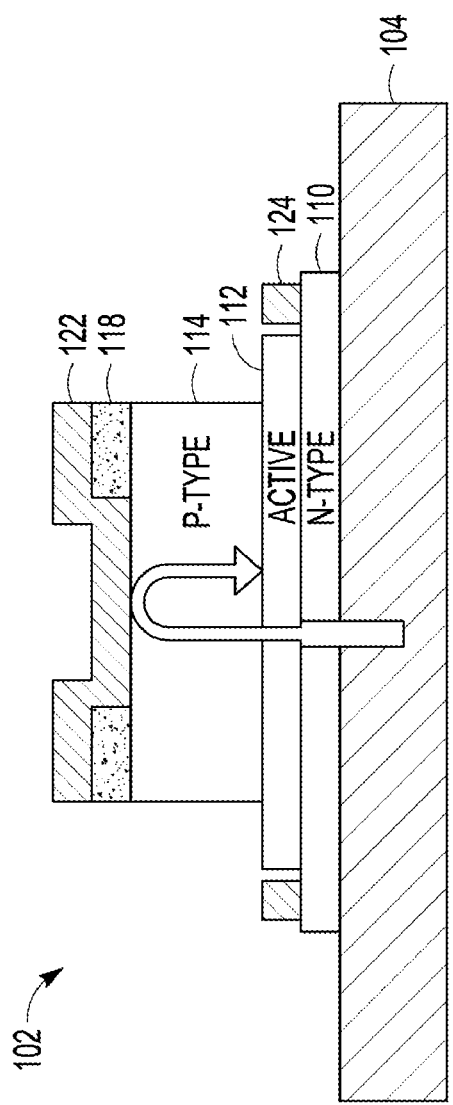
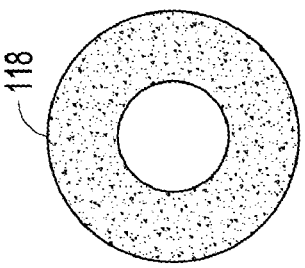
FIG. 1C
FIG. 1D

NORMAL INCIDENCE PHOTODETECTOR WITH SELF-TEST FUNCTIONALITY

PRIORITY

This application is a continuation of U.S. application Ser. No. 16/197,041 filed Nov. 20, 2018, which is incorporated by reference herein in its entirety.

TECHNICAL FIELD

This disclosure relates generally to photonic integrated circuits (PIC), and, in particular, to optical transceivers and photodetectors utilized therein.

BACKGROUND

In semiconductor-based integrated photonics, a normal incidence photodetector (NIPD) measures light that is incident on the detector perpendicularly to the wafer plane, whereas a waveguide-based photodetector (WGPD) captures light that has been routed to the detector by in-plane waveguides fabricated on the wafer surface. To detect external optical signals, e.g., coming from an optical fiber, the external light is coupled, in the former case, directly into the NIPD, and, in the latter case, into an on-chip waveguide that is, in turn, coupled to the WGPD.

Integrated optical transceivers, e.g., as used in optical communications networks, often provide self-test functionality that allows testing the operation of one or more WGPDs within the receiver by routing light from an on-chip light source of the transmitter internally to the WGPDs, obviating the need to provide an external optical signal for testing. Beneficially, self-testing can greatly reduce test time and test cost, as well as improve manufacturability. However, during normal operation, when light is received from external sources, WGPDs, due to the difficulties in first coupling into a waveguide, suffer from higher insertion losses than NIPDs. Conversely, existing NIPDs are not suited for self-testing, as it is difficult to optically couple them to on-chip waveguides. Additionally, materials and fabrication methods differ between NIPDs and waveguides. Accordingly, in selecting photodetector types, PIC designers have been presented the choice between low insertion losses on the one hand and self-test functionality on the other hand, but have not been able to achieve both simultaneously.

BRIEF DESCRIPTION OF THE DRAWINGS

Various example embodiments are herein described in conjunction with the accompanying drawings, in which:

FIG. 1A is a schematic cross-sectional view of an example NIPD with a uniform contact in accordance with various embodiments, and FIG. 1B is a top view of the uniform contact of FIG. 1A;

FIG. 1C is a schematic cross-sectional view of an example NIPD with a ring contact in accordance with various embodiments, and FIG. 1D is a top view of the ring contact of FIG. 1C;

DETAILED DESCRIPTION

Figure 2:
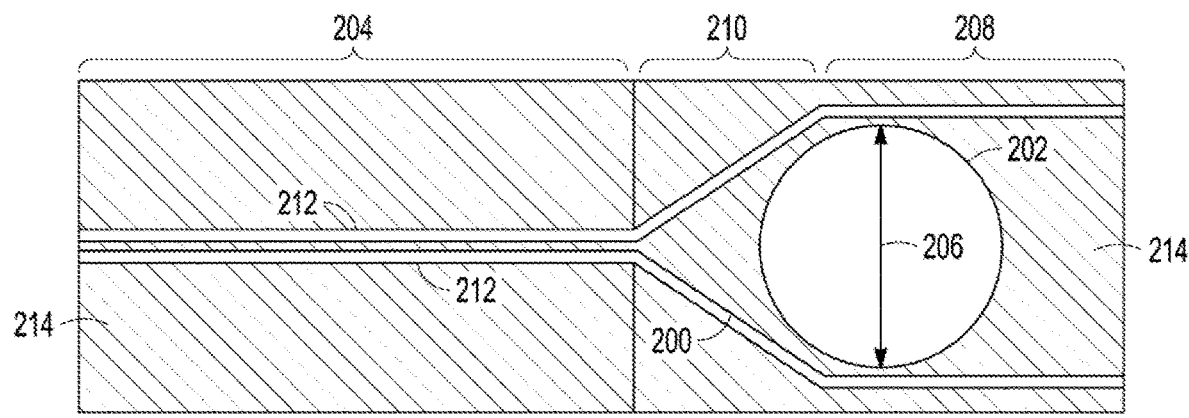
FIG. 2 is a diagrammatic top view of an example flared-out waveguide structure for coupling to an NIPD in accordance with various embodiments.

Disclosed herein are NIPD structures configured to allow for both in-plane and normal-incidence detection, facilitating self-tests to be performed while retaining, for normal operation, the low insertion losses associated with conventional NIPDs. Also described are optical transceivers incorporating such NIPD structures, as well as methods of calibrating and testing the transceivers in the course of manufacturing. In accordance with various embodiments, the NIPDs are implemented in a heterogenous material platform that integrates III-V materials (i.e., compound semiconductors made from a combination of group III and group V elements) with silicon photonics, enabling high-volume manufacturing in standard silicon fabrication plants. An NIPD in accordance herewith may include a p-i-n "mesa" (a flat, table-like structure), e.g., made of III-V material, with high-speed electrical connections bonded to a patterned semiconductor (e.g., silicon-based) wafer, with a waveguide formed in a semiconductor (e.g., silicon) device layer of the wafer coupling light into the p-i-n mesa. (A p-i-n structure, as understood in the art, is a layered structure comprising p-type, intrinsic, and n-type semiconductor layers.) In one embodiment, the waveguide flares to form a uniform strip underneath the p-i-n mesa for vertical coupling from the waveguide to the p-i-n mesa. In another embodiment, the waveguide "wraps around" the p-i-n mesa, in the sense that it includes a portion that is formed substantially along an edge of the p-i-n mesa (albeit in a layer underneath the mesa). (The term "substantially" indicates, in this context, that the wrap-around portion of the waveguide may have the same or slightly smaller or larger dimensions than the p-i-n mesa, corresponding to placement of the wrap-around portion directly underneath or slightly inside or outside the edge of the p-i-n mesa.) Light is coupled from the wrap-around portion vertically directly into the p-i-n mesa, and/or first laterally into a semiconductor structure underneath the p-i-n mesa and then from the semiconductor structure into the p-i-n mesa.

In the following, various example embodiments are described with reference to the accompanying drawings.

FIGS. 1A-1D schematically illustrate two example structures of NIPDs 100, 102 (not drawn to scale) in accordance with various embodiments. As shown in the schematic cross-sectional side views of FIGS. 1A and 1C, the NIPDs form layered mesas protruding from an underlying substrate, or wafer, 104. The mesas, and their constituent layers, may be shaped like disks (e.g., circular in top view, with possibly different diameters for different layers, as indicated), but other top-view shapes (e.g., ovals or squares) are also possible. While various of the drawings and accompanying description below depict and refer to "p-i-n disks," it is to be understood that these are example embodiments, and the disks can generally substituted by differently shaped p-i-n structures.

Suitable material selections for the various layers of the NIPDs 100, 102 and substrate 104 are generally well-known to those of ordinary skill in the art.

In some embodiments, the substrate 104 is a semiconductor-on-insulator (SOI) substrate including a semiconductor device layer on top of an insulating undercladding (not separately shown), which serves to vertically confine optical modes in waveguides and other photonic structures formed in the semiconductor device layer. The undercladding may, in turn, be formed on a thicker substrate layer or "handle" (not separately shown). For instance, the SOI substrate may include a silicon handle, oxide (e.g., silicon dioxide) cladding, and silicon device layer, but other material combinations may be used. For example, silicon nitride or doped silicon dioxide may be used, alternatively to silicon, for the semiconductor device layer; aluminum oxide may be used in lieu of silicon dioxide for the undercladding (and, similarly, any overcladding covering the p-i-n mesa); and the handle may have a layer or be made entirely of diamond instead of silicon.

The NIPDs 100, 102 are generally formed on top of the semiconductor device layer. Functionally, the NIPDs 100, 102 are p-i-n (or "PIN") diodes with an intrinsic region between p-type and n-type semiconductor regions. In accordance herewith, the intrinsic region is active, i.e., absorptive to electromagnetic radiation within an operating range (e.g., a portion of the visible and/or infrared regime). In more detail, the NIPDs 100, 102 may be composed of stacks of layers including, e.g., an n-type layer 110 (optionally including separate n-type cladding and contact layers), an active layer 112, a p-type cladding layer 114, and a p-type contact layer 116/118. The n-type layer(s) 110 and p-type contact layer 116/118 may vary in thickness depending on the electrical conductivity, contact metals, and optical absorption (e.g., between about 10 nm and about 5 µm), whereas the active layer may be chosen to absorb sufficient light (e.g., between about 100 nm and about 2 µm), and the p-type cladding layer may vary as well (e.g., between about 10 nm and about 5 µm). The layers 110-116/118 collectively form the p-i-n mesa (or, in this example embodiment, p-i-n disk). In some embodiments, only a single p-type layer is used to provide the functionality of both the p-type cladding layer 114 and of the p-type contact layer; such a p-type layer may be shaped like the p-type contact layer 116 or 118. The NIPDs 100, 102 may also include bonding layers (not shown) between the p-i-n disks and the underlying substrate 104 to facilitate heterogeneous integration by improving the adhesion of the bond and rendering the bonding process independent of the particular materials chosen.

The p-i-n disk (layers 110-118) may be made of group III-V materials, such as, e.g., gallium arsenide (GaAs), aluminum arsenide (AlAs), indium gallium arsenide (InGaAs), or indium phosphide (InP), among others. For example, in some embodiments, the active layer is made of InGaAs, and the n-type and p-type layers are made of InP or AlInGaAs (doped, e.g., with silicon (Si), beryllium (Be), or zinc (Zn)). Alternatively, the p-i-n disk may be made of group IV materials, e.g., germanium (Ge) or SiGe, suitably doped (e.g., with boron and arsenic). The active layer 112 may be a bulk semiconductor layer, or may, alternatively, be composed of quantum wells, quantum dots, or quantum dashes.

Electrical connections to the p-i-n disks of the NIPDs 100, 102 are provided by a contact metal layer 120/122 disposed on top of the p-type contact layer 116/118 and a circumferential contact metal ring 124 on top of the n-type layer 110. Common metals used for these contacts include gold (Au), platinum (Pt), and titanium (Ti), but many alternative contact metals are available, including Al and Zn.

The NIPDs 100, 102 are usually configured for bottom illumination (with reference to the orientation shown in FIGS. 1A-1D) through the substrate 104. That is, in use, light is incident, in a direction generally normal to the wafer plane and layers of the NIPD 100, 102, onto the bottom surface of the substrate 104, and propagates through the substrate 104 (which is, accordingly, made from a material selected for its transparency to light within the wavelength range of interest, e.g., the near-IR regime between about 1 µm and about 2 µm, or the near- to mid-IR regime extending beyond 2 µm) and the n-type, active, and p-type layers of the NIPD 100, 102 until it is reflected at the top contact metal layer 120/122. Primarily in the active layer 112, the light is absorbed and converted into electron-hole pairs through the photoelectric effect, creating a photocurrent that can be measured between the contact metals 120/122 and 124. In the illustrated embodiment, the order of materials is chosen such that the light passes first through the n-type layer(s) 110. This order is beneficial because n-type materials generally have lower optical absorption. However, in principle, the layer structure could also be reversed (by switching out the dopants between the layers above and underneath the active layer), with a thin p-type cladding layer on the bottom and an n-type layer being placed at the top; in this case, the upper contact layer (corresponding to layer 116/118) may be omitted.

The NIPDs 100, 102 shown in FIGS. 1A-1B and 1C-1D, respectively, differ in the respective shapes of the p-type contact layer, each of which provides both advantages and disadvantages. The NIPD 100 of FIGS. 1A and 1B has a uniform p-type contact layer 116 (hereinafter also "uniform contact" 116) that, in the top view shown in FIG. 1B, takes the form of a circular disk. The p-type contact layer 118 of the NIPD 102 of FIGS. 1C and 1D, by contrast, forms an annulus or ring (hereinafter also "ring contact," shown in top view in FIG. 1D) interfacing with the p-type cladding layer 114 underneath along the circumference of the top surface of the cladding layer 114. The uniform contact 116 has a larger contact area and consequently lower electrical resistance, which provides the benefit of increased bandwidth of the NIPD 100, allowing it to operate at higher speed than an otherwise similar NIPD with a ring contact 118. The ring contact 118, on the other hand, reduces optical losses of light reflected into the active layer 112, as the light in the central region interior to the ring contact 118 is immediately reflected back at the interface between the p-type cladding layer 114 and the metal layer 122 rather than first having to go through a p-type contact layer. Lower optical losses, in turn, improve the responsivity of the photodetector. Accordingly, the choice between NIPD structures 100, 102 presents a trade-off between bandwidth/speed on the one hand and responsivity on the other hand; which structure is being used generally depends on the criteria imposed by the specific application. Note that the NIPD 102 with ring contact 118, unlike the NIPD 102 with uniform contact 116, could also be used with top illumination if the contact metal of top metal layer 122 was removed in the central region, leaving only a ring-shaped metal contact.

Figure 3:
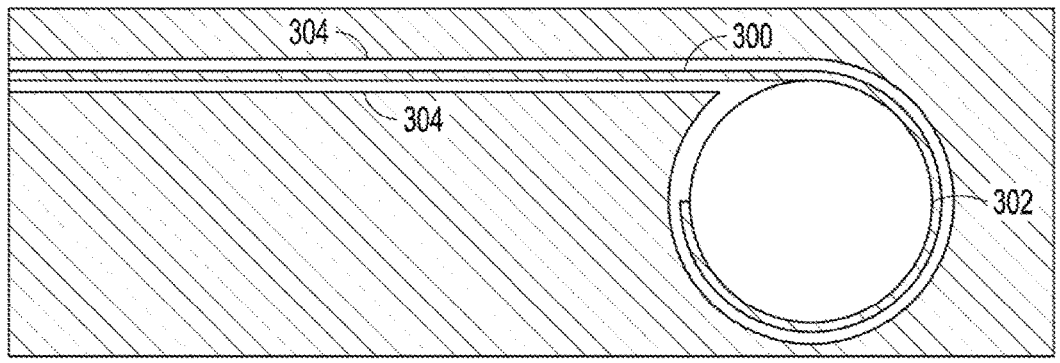
FIG. 3 is a diagrammatic top view of an example wrap-around waveguide structure for coupling to an NIPD in accordance with various embodiments.

In accordance with various embodiments, the NIPDs 100, 102 are enhanced with waveguides structures, patterned in the substrate 104, that allow to couple light travelling in-plane with the substrate into the NIPDs 100, 102 to enable self-test functionality. FIGS. 2 and 3 are diagrammatic top views of two example waveguide structures that may be employed for this purpose. The structures may be designed with a view towards maximizing in-plane responsivity of the NIPDs 100, 102 and minimizing optical reflection during self-tests. The latter may impact the bit-error-rate, and therefore it affects the quality and usefulness of the self-test.

FIG. 2 is a diagrammatic top view of an example flared-out waveguide structure 200 for coupling to an NIPD 202 (such as NIPD 100 or 102) in accordance with various embodiments. The waveguide structure 200 flares out from a waveguide portion 204 having a width that is substantially smaller than the diameter 206 of the NIPD 202 to a strip portion 208 (or simply "strip") that is comparable in width to the diameter 206 of the NIPD 202 (or exceeds the diameter 206 of the NIPD 202). For purposes of this discussion, the diameter 206 denotes the largest diameter of the active region in the layered p-i-n disk, e.g., in the embodiments shown in FIGS. 1A and 1C, the diameter of the n-type layer 110. The NIPD 202 may have a diameter 206 between, for instance, 5 μm and 50 μm. The narrower waveguide portion 204 generally has a width suitable for single-mode routing, e.g., of less than 5 μm; in accordance with various embodiments, the width of waveguide portion 204 is less than half the diameter of the NIPD 202 for that width to be deemed "substantially smaller" than the diameter of the NIPD 202. The strip portion 208, which is placed underneath the NIPD 202, may fully encompass the NIPD 202 in width, as shown in FIG. 2, although a narrower strip portion 208 is also possible. In various embodiments, the strip portion 208 has a width between 50% and 200% of the diameter of the NIPD. The strip 208 may extend several NIPD diameters 206 beyond the NIPD 202 and then terminate. Optionally, the strip 208 may taper down before termination, be roughened at a terminating surface, or be otherwise structured to avoid or reduce reflections at the terminal end.

In the flared portion 210, the width of the waveguide structure 200 may linearly increase from the narrower width of the waveguide portion 204 to the greater width of the strip portion 208, as shown in FIG. 2. Alternatively, the flared portion 210 may have some curvature that provides a smoother transition between the narrower waveguide portion 204 and the strip portion 208. During self-test mode of the NIPD structure, an optical mode propagating down the waveguide portion 204 expands in the flared portion 210 and is, in the strip portion 208, laterally only weakly guided or unguided. In the region underneath the NIPD 202, the light is absorbed from the strip 208 into the NIPD 202, allowing the optical performance of the NIPD 202 to be measured. Since the strip 208 forms a uniform silicon layer underneath the NIPD 202, the presence of the strip 208 has no impact on the normal-incidence absorption of the NIPD 202, which ensures that high normal-incidence performance of the NIPD during normal operation is maintained.

The flared-out waveguide structure 200 can be created in the silicon device layer of an SOI substrate by forming narrow channels 212 to both sides of the waveguide structure 200, defining the waveguides structure 200 in between. The regions 214 outside and surrounding the channels 212 and waveguide structure 200 may be left a solid silicon layer (as shown), or may be structured in accordance with some regular fill pattern (e.g., silicon posts in a lattice arrangement) to achieve a greater degree of uniformity of the silicon density across the silicon device layer, as is customary in the art. Patterning of the silicon device layer to form the channels and, optionally, fill pattern can be accomplished using standard photolithographic and etching techniques.

While the flared-out waveguide structure 200 may find use in many PIC designs, as waveguide widths are usually substantially smaller than the diameters of the NIPDs, it is noted that, in some PICs, a waveguide carrying a signal for coupling into an NIPD may have a width on the order of (e.g., at least half of) or greater than the diameter of the NIPD; in such a case, coupling into the NIPD from the waveguide underneath works the same as described above in principle, but a mediating flared waveguide portion is not needed.

FIG. 3 is a diagrammatic top view of an example wrap-around waveguide structure 300 for coupling to an NIPD 302 (such as NIPD 100 or 102) in accordance with various embodiments. The waveguide structure 300 curves, in the top view, in an arc around at least part of the circumference of the p-i-n disk of the NIPD 302 to couple light, directly or indirectly, into the p-i-n disk. For example, as explained in more detail below with reference to the cross-sectional views of FIGS. 4A-4D, the curved, or wrap-around, portion of the waveguide structure 300, which is formed underneath and (in top view) along the edge of the bottom layer (e.g., n-type layer 110) of the p-i-n disk, may couple light laterally into a disk formed in the semiconductor device layer of the substrate underneath the p-i-n disk (which then couples the light vertically into the p-i-n disk), or directly vertically up into the p-i-n disk. The waveguide structure 300 may have a waveguide width and modal index designed to provide optimal coupling to the p-i-n disk or semiconductor disk formed underneath, and may taper to a narrower width before terminating to minimize back reflections. The wrap-around waveguide structure 300, like the flared-out waveguide structure 200 of FIG. 2, can be created in the silicon device layer of an SOI substrate by forming narrow channels 304 to both sides of the waveguide structure 300.

FIGS. 4A-4D are diagrammatic cross-sectional views of various layer structures of an NIPD 302 and associated wrap-around waveguide structure 300 formed in an SOI substrate including a handle 400, insulator (e.g., buried oxide) layer 402, and semiconductor device layer 404, in accordance with various embodiments. For ease of reference during the following description of FIGS. 4A-4D, the device layer 404 is deemed to be made of silicon; however, other suitable semiconductor materials may also be used. In the depicted example, the p-i-n structure of FIG. 1A is shown separated from the silicon device layer 404 by a bonding layer 406 (which is, however, optional), and covered by a top cladding 408. A metal via 410 providing the electrical connection to the contact metal 124 on top of the n-type layer 110 is also shown.

Figure 4A:
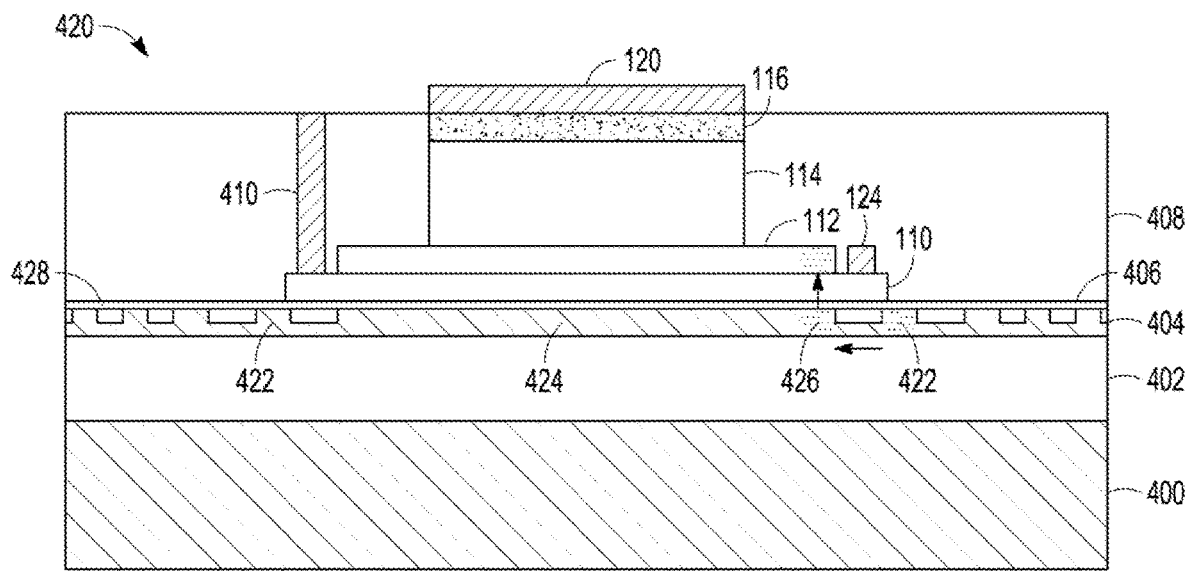
FIGS. 4A-4D are diagrammatic cross-sectional views of various layer structures of an NIPD structure with a wrap-around waveguide in accordance with various embodiments.

FIG. 4A shows an example layer structure 420 in which the silicon device layer 404 is partially etched to form a waveguide 422 substantially along (and underneath) the edge of the n-type layer 110 of the p-i-n disk, leaving a solid silicon disk 424 in the silicon device layer 404 underneath the p-i-n disk. The optical mode 426 couples from the curved waveguide 422 into the silicon disk 424, and then from the silicon disk 424 up into the p-i-n disk (e.g., via the n-type layer 110 into the active layer 112). As shown, the silicon device layer 404 may also be etched, in the region surrounding the NIPD, to create a fill pattern 428.

Figure 4B:
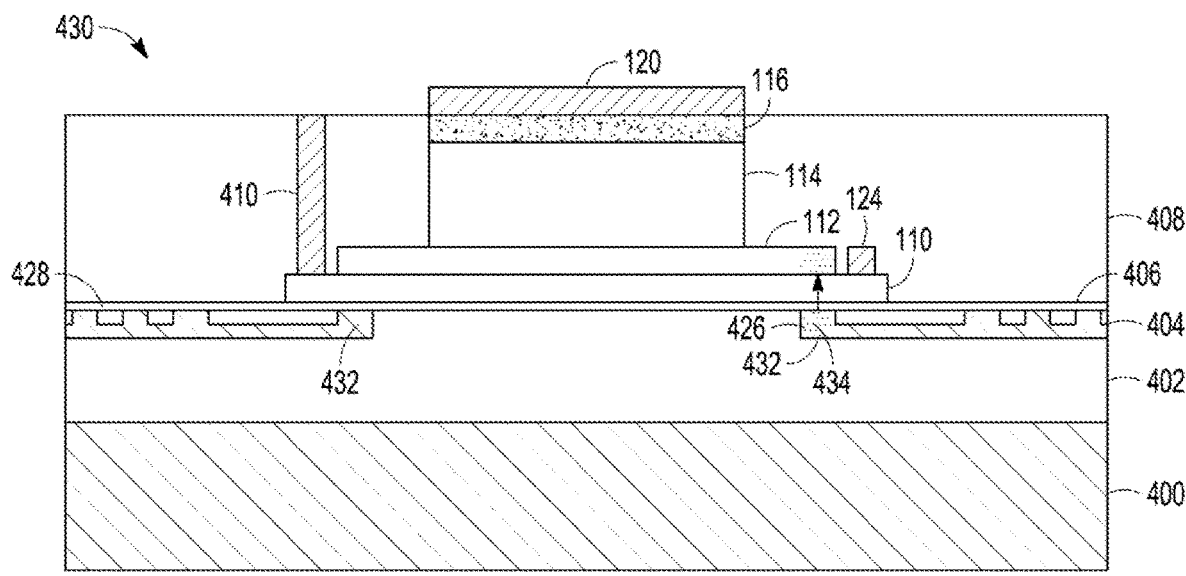
Figure 4C:
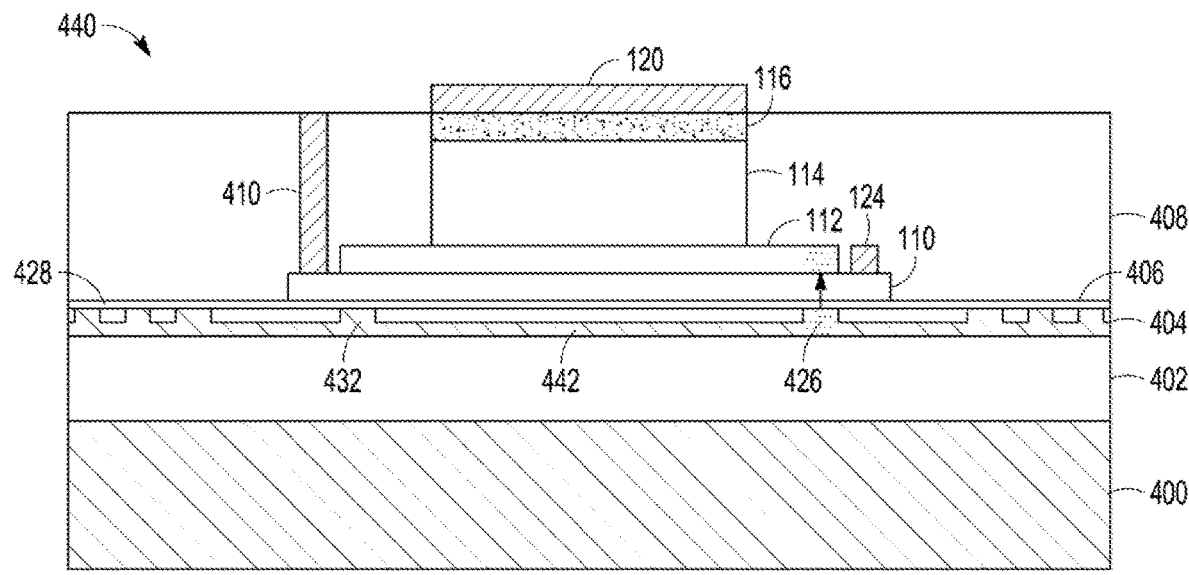

FIG. 4B shows a slightly varied layer structures 430, in which the silicon device layer 404 is fully etched down to the buried oxide layer 402 in the region underneath the p-i-n disk. (In this case, the inner wall of the wrap-around waveguide 432 is formed implicitly, whereas the outer wall is defined by a channel etched into the silicon device layer 404.) The wrap-around waveguide 432 is, in this embodiment, moved inwards a bit (e.g., as shown, to be located underneath the edge of the active layer 112), and the optical mode 434 couples directly from the waveguide 432 vertically into the p-i-n disk. FIG. 4C provide a layer structure 440, otherwise similar to that of FIG. 4B, in which the silicon in the region underneath the p-i-n disk is only partially etched, leaving a thin silicon disk 442 of uniform thickness. Beneficially, partially or fully etching the silicon device layer 404 underneath the p-i-n disk, as shown in FIGS. 4B and 4C, lowers the optical losses of light coupled into the disk from below, albeit at the cost of lower bonding quality of the p-i-n disk to the substrate (as compared with the structure 420 of FIG. 4A).

Figure 4D:
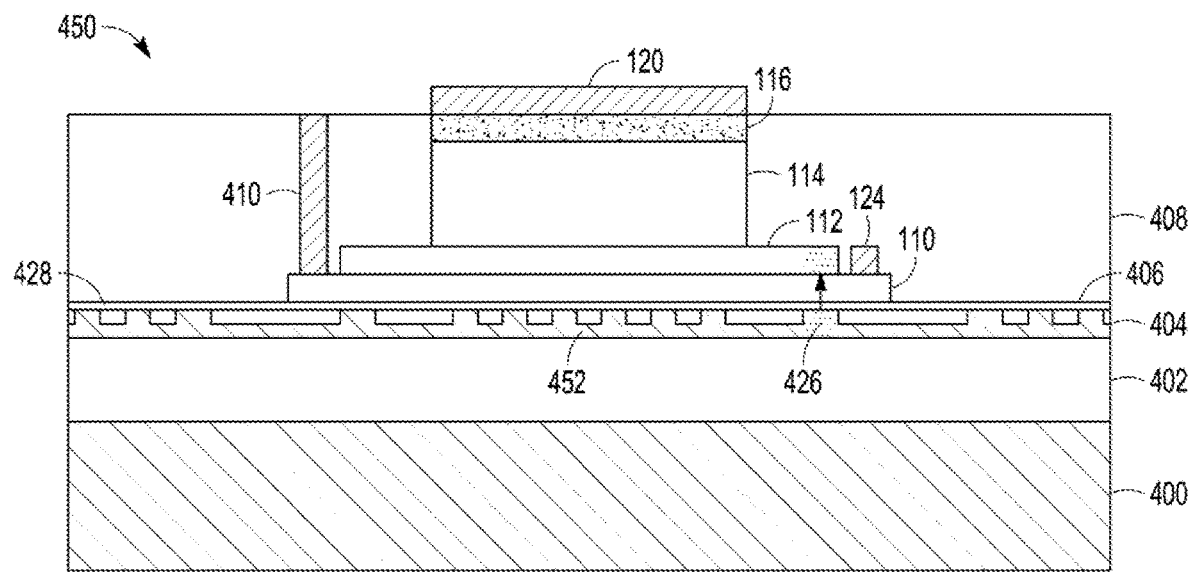

FIG. 4D shows an example layer structure 450 that mediates between, and thereby balances the benefits and detriments of, retaining a full-thickness silicon disk underneath the p-i-n disk (as is the case in structure 420 of FIG. 4A) and removing the silicon (as is the case for structure 430 in FIG. 4B) or at least reducing it in thickness (as is the case for structure 440 in FIG. 4C). In this layer structure 450, a fill pattern 452 is created in the silicon underneath the p-i-n disk for a trade-off between good (but not optimal) bonding and low (but not optimal) optical losses. The etched silicon fill pattern underneath the p-i-n disk may also create a more uniform light intensity at the NIPD active layer 112 through scattering, and may result in improved carrier extraction and bandwidth. The regions of the fill pattern where silicon is removed are filled with a cladding material (e.g., the same as used for the insulator layer 402).

The NIPDs 202, 302 and associated waveguide structures 200, 300 described herein can be used in a variety of optical communications applications and wavelength regimes. One example application, described in more detail below, is an integrated optical transceiver. Other areas in which the NIPDs 202, 302 may be used include sensing, imaging, or lidar applications. For instance, in an infra-red camera including a large array of NIPDs, self-test functionality enabled with the described NIPD embodiments can be used to identify functional and damaged pixels. This self-test can also be beneficial in coherent infrared imaging (i.e. phased array detector) as well, where a local oscillator (i.e. laser) is mixed with the incoming signal before each NIPD.

Figure 5:
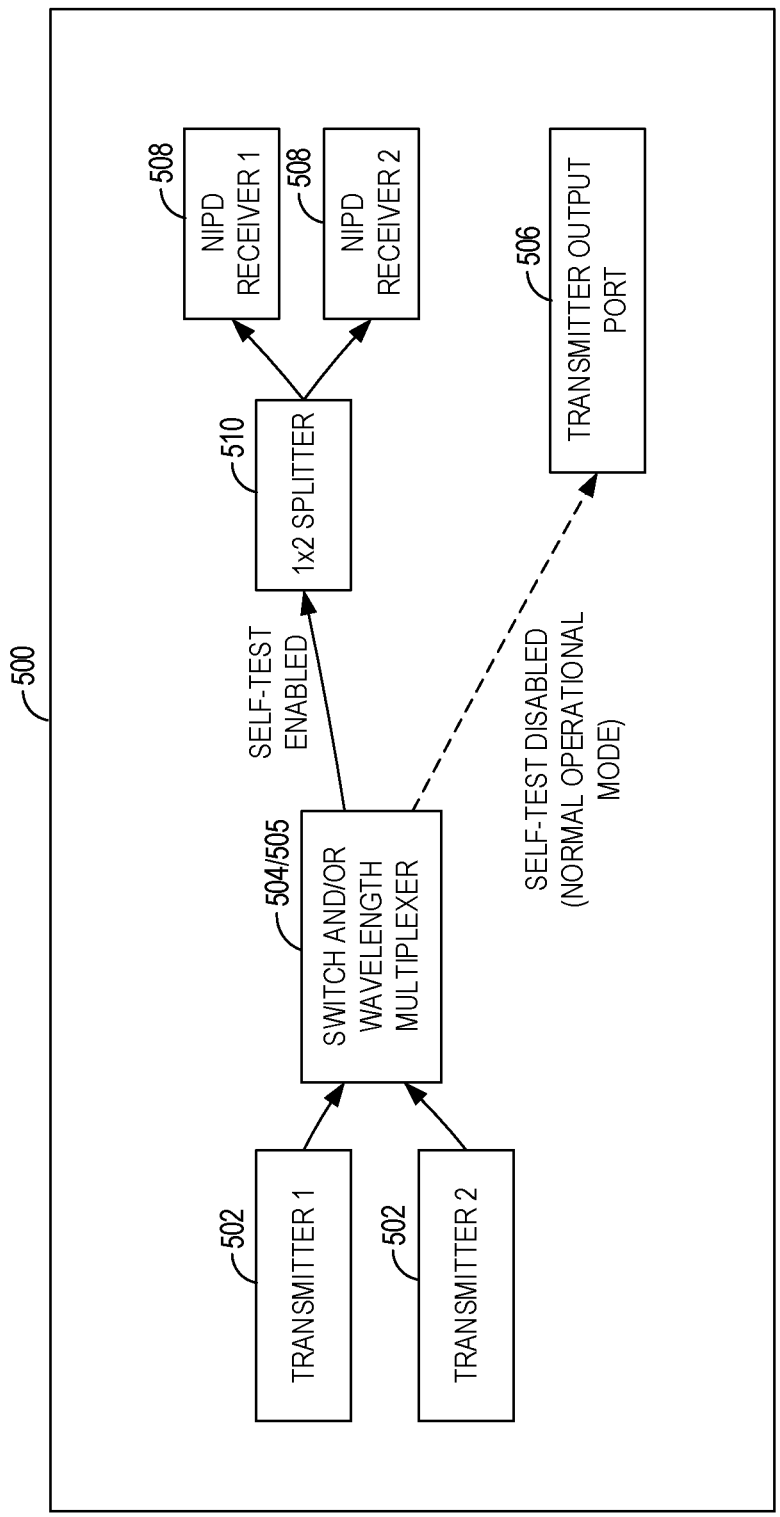
FIG. 5 is a schematic diagram of optical components of an example optical transceiver in accordance with various embodiments.

Turning now to optical-transceiver applications, FIG. 5 shows a conceptual diagram of various optical components of an example optical transceiver 500 in accordance with various embodiments. The optical components, which may be integrated on a single substrate or die, include one or more transmitters 502, an optical switch 504 and/or wavelength multiplexer 505, a transmitter output port 506, one or more NIPDs serving as receivers 508, and, optionally, a power splitter 510 associated with the receivers 508. Multiple transmitters 502 operating at different respective wavelengths may serve to provide different signal channels, and multiple respective receivers 508 may be optimized for or tailored to the respective wavelengths via the material selections and thicknesses of their NIPD layers. In the depicted example, the optical transceiver 500 includes two transmitters 502 and two respective receivers 508. It is to be understood, however, that the optical transceiver 500 may, and in practice often does, include more than two transmitters 502 and receivers 508.

The transmitters 502 may each be implemented by a laser and an associated electro-optic modulator that imparts an electronic signal onto light generated by the laser in the form of a phase and/or amplitude modulation. A multiplexer 505, e.g., implemented as an arrayed waveguide grating (AWG), may combine the signals from multiple transmitters 502 into a multiplexed signal carried on a single waveguide at the output of the multiplexer 505. The multiplexer 505 may double as an optical switch 504, responsive to a (typically electronic) control signal, that selectively directs the multiplexed optical signal either to the transmitter output port 506 during a normal operational mode of the transceiver 500, or to the receiver(s) 508 during a "loop-back" or self-test mode. The control signal may be provided, for instance, by a control processor in the optical transceiver assembly, or, during wafer-level testing in a wafer test tool, which interfaces the wafer through a probe-head stack up, by a control program written into the wafer-level test program. The optical switching functionality that enables or disables the self-test mode may be provided, for instance, by a heater or other active tuning element in the multiplexer that changes the optical path-lengths of signals within the multiplexer to focus them on one or the other of two outputs optically connecting the multiplexer 505 to the transmitter output port 506 and receiver(s) 508, respectively. In embodiments with only a single transmitter 502, a simpler optical switch 504, e.g., implemented by a Mach-Zehnder modulator, may take the place of the multiplexer 505. Such an optical switch 504 may also be used as a separate component at the output of the multiplexer 504 in embodiments with multiple transmitters 502, as an alternative to using the multiplexer 505 simultaneously as a switch 504. The signal output by the multiplexer 505 may be sent first to a power splitter 510, which splits the signal between the multiple receivers 508, e.g., in a 1×2 ratio for two receivers 508 as depicted. The receivers 508 may be tested one at a time by turning on only one of the transmitters 502 (e.g., the transmitter 502 that generates a signal at the wavelength for which the receiver 508 is designed to test only at that wavelength, or each transmitter in turn to test at all wavelengths).

In accordance with some embodiments, the various components of the optical transceiver 500 are created as part of a single PIC using heterogeneous silicon/III-V integration. In general, manufacturing an integrated optical transceiver includes a sequence of layer-deposition, bonding, and subtractive or additive patterning steps. Several techniques for performing these steps to create device structures in accordance herewith are known to those of ordinary skill in the art. The deposition of silicon, III-V, cladding, or metal contact layers, for example, may be achieved by chemical vapor deposition, sputtering, or chemical or molecular beam epitaxy, among other techniques. The deposited layers can be physically patterned by photolithographically defining the device structures, followed by manufacturing the defined structures by subtractive processes such as wet or dry etching, or additive processes such as lift-off or electroplating. In various embodiments, a III-V stack from which the p-i-n structure is to be formed is created separately and then bonded to a patterned SOI substrate (having waveguides and other optical structures already formed in the device layer). The III-V stack can then be patterned to form the various layers of the p-i-n mesa (e.g., disk), and contact metals can be created to establish the electrical connections to the n-type and p-type layers. In some embodiments, a top cladding is deposited (e.g., after formation of a contact metal ring on the n-type layer) to enclose the III-V structure. The top cladding may be patterned and etched to expose the p-type layer for forming the associated contact metal and/or to form vias for connection to the contact metal ring of the n-type layer. Multiple PICs are usually created simultaneously on a single wafer, which can then be diced into individual chips (or dies) each corresponding to a single PIC.

Figure 7:
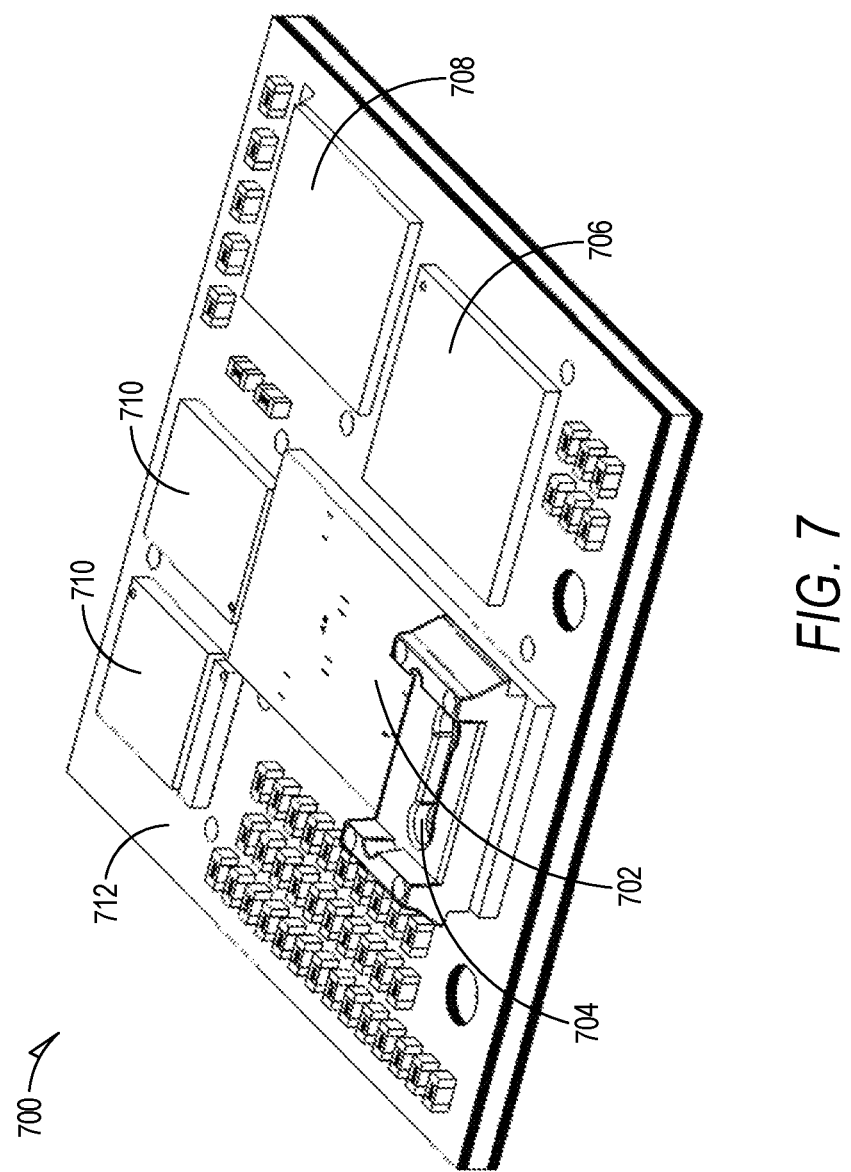
FIG. 7 is a perspective view of an example implementation of an optical transceiver, in accordance with some embodiments.

To assemble a complete transceiver package, the PIC die may be flip-chip-bonded to an assembly-level substrate that provides electrical and/or optical connections for the PIC; the assembly-level substrate may also serve as a common substrate for the transceiver PIC and any additional photonic and/or electronic modules used in the same package (such as, e.g., control ASIC 706, microcontroller 708, or chipset 710 depicted in FIG. 7). The assembly is expensive, and, therefore, PICs are generally tested upon completion of the wafer fabrication, and only passing PICs with high quality are released from wafer-level to assembly-level manufacturing. The individual components of the optical transceiver may be tested sequentially, starting from the transmitter laser and ending with the NIPD. During wafer-level testing, the NIPD is usually tested only for the absorption-based optical responsivity (as measured in terms of the ratio between a photocurrent and the intensity incident upon the detector that causes the current). Upon assembly, the test sequence may be repeated, but since the electrical data source for modulating the optical transmitter is connected at that point, high-speed data packets can be applied to the optical transmitter, and the corresponding data received, in self-test mode, by the NIPD can be used to also characterize the NIPD in terms of its bandwidth, packet loss, and/or bit error rate (BER). Additional wafer-level testing could include bandwidth, packet loss, and/or BER, but this is evaluation is often not available on standard wafer-level test systems.

Figure 6:
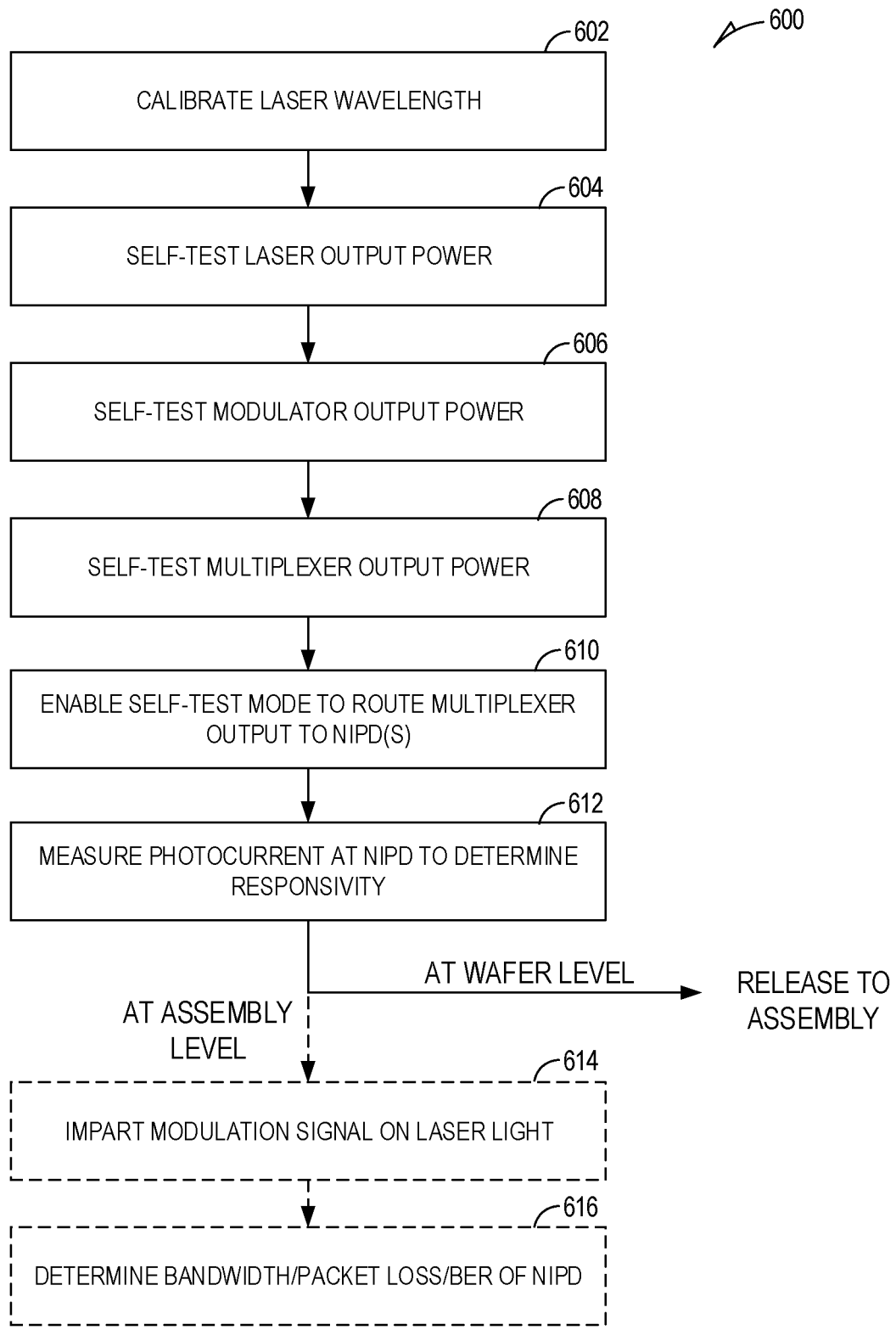
FIG. 6 is a flowchart illustrating an example method of calibrating and testing an optical transceiver in accordance with various embodiments.

FIG. 6 is a flowchart illustrating an example test flow 600, in accordance with various embodiments, for an optical transceiver 500 including a multiplexer 505. A first portion (corresponding to acts 602-612) of this test flow may be used both during wafer-level and during assembly level testing, with further acts 614-616 added during assembly-level testing. The test flow 600 begins with calibrating the wavelength of the on-chip transmitter laser (act 602), and then proceeds to self-tests of the transmitter laser output power (act 604), the transmitter modulator output power (act 606), and the multiplexer output power (act 608). To test the NIPD, the multiplexer (or a separate optical switch) enables the self-test mode to route the multiplexer output to the NIPD (act 610), where the in-plane light is coupled, e.g., by a flared-out or wrap-around waveguide 200, 300 as described above, into the NIPD. The resulting photocurrent generated at the electrical connections of the NIPD is measured to determine the responsivity of the NIPD (act 612). For a given multiplexer output power (or output power of other preceding components in the optical path), a minimum measured photocurrent corresponding to passing NIPD performance can be established. Upon passing the responsivity self-test during wafer-level testing, the optical transceiver is released to assembly. During assembly-level testing, the quality of the NIPD may be further characterized by imparting a high-speed modulation signal onto the light generated by the transmitter laser (act 614), and measuring, still in self-test mode, the bandwidth, packet loss, and/or bit error rate (BER) at the NIPD (act 616). Ways of evaluating these and other performance metrics of the NIPD based on the measured photocurrent are well-known to those of ordinary skill in the art.

Beneficially, the self-test enabled by the NIPD structures described herein allows testing the optical transceiver, including the NIPDs, using standard, high-volume manufacturing equipment (that is, avoiding the need for custom test equipment), which, in turn, facilitates rapid, low-cost product testing.

The devices, systems, and methods discussed above rely on wafer-level processes for manufacturing and alignment. Most or all optical elements are formed through mature processes that have been developed for semiconductor manufacturing, such as photolithography and etching. For example, current photolithography techniques can routinely provide feature sizes down to 45 nm, over a 300 mm-diameter silicon wafer.

Compared to more traditional optical systems, in which components are manufactured discretely and aligned to one another, the wafer-level approach offers a significant benefit of scalability. It may be relatively expensive to own or buy time on a photolithography machine, but the expense is easily recovered by the economy of scale. A single wafer can produce thousands of parts. In addition, the parts themselves can include components that are aligned to one another through the lithographic process, which can avoid costly and tedious manual alignment of components to one another. In addition, the optical system can be packaged as an application-specific integrated circuit (ASIC), and integrated into switching systems alongside other purely electrical ASICs. Along with the convenience in packaging as an ASIC, the optical system can achieve the reliability of an ASIC, with single-chip and solid-state devices that are more reliable than comparable systems formed from discrete components.

FIG. 7 shows an example implementation of an optical transceiver 700, in accordance with some embodiments. The optical transceiver 700 can send and receive optical signals (e.g., optical beams upon which data is encoded). The optical transceiver 700 is suitable for use in data center servers, optical ethernet, and other applications. For example, in a cloud data center network, the optical transceiver 700 can be used for spine-spine optical interconnects, spine-leaf optical interconnects, and leaf-ToR (top of rack) optical interconnects. The optical transceiver 700 can be used in other suitable applications as well.

The optical transceiver 700 can include a photonic integrated circuit (PIC) 702, which can perform any combination of producing light, detecting light, modulating light, demodulating light, amplifying light, attenuating light, separating multi-wavelength light into light at individual wavelengths, combining light at individual wavelengths into multi-wavelength light, convert signals between the electrical and optical domains, and other suitable optical functions.

Waveguides can transport light into and out of the photonic integrated circuit 702, and can transport light from element to element within the photonic integrated circuit 702. The waveguides can include a core material with a relatively high refractive index, such as silicon, surrounded by a cladding material with a relatively low refractive index, such as silicon dioxide. Both silicon and silicon dioxide are transparent at infrared wavelengths, such as between 1.2 micron and 3.0 microns. In some examples, the waveguides can be formed in layers on a substrate, such as by providing a substrate having a silicon layer on a buried oxide layer, etching trenches in the silicon layer, filling in the trenches with additional oxide material, and polishing the additional oxide material of the filled-in trenches to a desired cladding thickness on a top of the waveguide. In some examples, the waveguides can be shaped as rib waveguides, which can confine a light beam in two dimensions orthogonal to a direction of propagation in the waveguide, and can maintain a constant cross-section along the direction of propagation. In some examples, the rib waveguides can have a trapezoidal cross-section, with parallel top and bottom surfaces (e.g., the surfaces facing toward and away from the substrate on which the waveguides are formed), and angled side surfaces. In some examples, the angle can be 90 degrees, so that the waveguide has a rectangular cross-section. In other examples, the angles can be close to 90 degrees, such as between 80 degrees and 90 degrees, due to limitations in a lithographic exposing or etching process.

While some waveguides are intended to transport light from location to location in a photonic integrated circuit, other waveguides can intentionally impart a gain or a loss to the light that passes through the waveguides. For example, a waveguide can include an active portion, in which the inactive silicon material can be replaced with an optically active material, such as InP.

Some waveguides can be formed with different material than the silicon core and the silicon dioxide cladding. For example, one or more of the waveguides can replace some of the silicon core, which is optically inactive, with an active material, such as InP. By electrically biasing the active material, light passing through the active material can be selectively amplified or absorbed. In general, InP can be used only where optically active material is needed because it is less transparent, more expensive, and more fragile than silicon. The active material can also be placed in the waveguide at the wafer level, using common techniques from the semiconductor industry.

In some examples, it may be desirable to couple light from one waveguide to another waveguide. For example, it may be desirable to couple light from an inactive waveguide to a separate active waveguide that includes an active portion, then back to the inactive waveguide. For these cases, it may be convenient to position the active waveguide in a separate layer on top of the inactive waveguide. Coupling between the waveguides can be achieved by suitably tapering a width of one or both of the waveguides. Such a configuration can be convenient for locating electrodes on opposite sides of the active portion, so that the electrodes can be positioned in the same layer as the active material.

In some examples, active material can be used as attenuating material to form an electro-absorption modulator, which can electrically bias the active material to attenuate light at prescribed times. The electro-absorption modulator can impart a slowly-varying attenuation onto a light beam, and/or can impart a data signal onto a light beam. Alternatively, when the active material is used to impart gain onto light in the active waveguide, the inactive waveguides can include reflectors on either side of the active waveguide to form a laser cavity. In some examples, such a laser cavity need not be actively cooled, which can reduce power requirements and simplify the overall design of the photonic integrated circuit. In some examples, output light can be coupled out of the laser cavity through a vertical coupler (e.g., toward or away from the substrate on which the laser is formed). Such vertical coupling can be beneficial in that the laser need not have an active facet from which the laser light emerges. Because active facets can be prone to heat-induced failure, omitting the active facet can help improve the reliability and lifetime of the laser.

In some examples, waveguides can be used to form spectral filters, which can transmit light at one or more prescribed wavelengths, and attenuate light at wavelengths different from the prescribed wavelength or wavelengths. For example, a Fabry-Perot filter can be formed as a section of a waveguide, the section being bounded by two reflectors in the waveguide. The Fabry-Perot filter is transmissive at wavelengths for which the round-trip optical path length between the reflectors equals an integral number of wavelengths, and attenuating for wavelengths away from the transmissive wavelengths. As another example, a ring resonator can be formed adjacent to a first waveguide. When a round-trip optical path length around the ring resonator equals an integral number of wavelengths, light in the first waveguide can couple into the ring resonator, and can couple out of the ring resonator into a second waveguide adjacent to the ring resonator. Such a ring resonator exhibits peaked wavelengths, at which there is enhanced coupling into and out of the ring resonator, and minimal coupling away from those peaked wavelengths.

Although these spectral filters can function in a passive manner, they are typically more useful if they can be actively controlled. For example, a portion of the waveguide between the Fabry-Perot reflectors, or within the ring resonator, can include an optically active material, which can vary in refractive index as a function of temperature. A heater positioned adjacent the optically active material can control a temperature of the active material, can therefore control an optical path length within the spectral filter, and can therefore control the wavelength (or wavelengths) at which the spectral filter is transmissive. In some examples, the active material can be positioned in a separate layer on top of the inactive waveguide. Coupling between the waveguides can be achieved by suitably tapering a width of one or both of the waveguides. Such a configuration can be convenient for locating a heater adjacent to the active material, so that the heater can be positioned in the same layer as the active material.

A Mach-Zehnder interferometer can use a variable refractive index material such as a heated waveguide or InP-based phase modulator to form an efficient beam attenuator or modulator. A Mach-Zehnder interferometer can split an incident beam into two beams, vary an optical path length of one of the beams, then interfere the two beams to produce an output beam. The Mach-Zehnder interferometer is transmissive at wavelengths for which the optical path difference between the two arms equals an integral number of wavelengths, and attenuating (to varying degrees) at wavelengths between the transmissive wavelengths. Mach-Zehnder interferometers can function as efficient attenuators or modulators because the optical path difference required to swing from fully transmissive to fully attenuating is half of a wavelength.

One or more of an array waveguide grating, a ring resonator, and/or a Mach-Zehnder interferometer can be combined to form a multiplexer, which can combine two or more input beams at different wavelengths into a single output beam having multiple wavelengths. Similarly, these elements can also be combined to form a demultiplexer, which can separate a single input beam having multiple wavelengths into two or more output beams at different wavelengths. The multiplexer and demultiplexer can operate with light having a data signal (e.g., modulated at a particular data rate), or with relatively slowly-varying light that lacks a data signal.

A photonic integrated circuit 702 can include one or more photodetectors, e.g., configured as described herein and depicted in FIGS. 1A-4D, which can produce an electrical signal in response to a level of sensed light in a waveguide. The electrical signal can be processed by a processor located on the photonic integrated circuit 702, on the optical transceiver 700 away from the photonic integrated circuit 702, or away from the optical transceiver 700.

A photonic integrated circuit 702 can optionally include one or more fiber couplers, which can couple light vertically (e.g., toward or away from the substrate on which the photonic integrated circuit 702 is formed) into or out of the photonic integrated circuit 702. In some examples, the fiber coupler can include a relatively precise mechanical housing, such as an optical interface platform 704, so that the mechanical housing can determine the position and direction of the fiber when the fiber attaches to the housing. Such a precise housing can allow passive coupling to the fiber (as opposed to active coupling, in which a position and/or direction of the fiber is actively adjusted to optimize a coupling efficiency). In some examples, the optical interface platform 704 can include a rematable fiber interface that can simultaneously attach or detach up to eight fibers, although other values can also be used. In some examples, light may be coupled between the photonic integrated circuit and two orthogonal polarizations of light in the fibers. In an output coupler, two beams on the chip may be polarization-multiplexed onto a single fiber.

The photonic integrated circuit 702 can arrange the optical components described above to form a number of devices.

For example, the photonic integrated circuit 702 can be configured as a local area network wavelength division multiplexer (LAN-WDM) or a coarse wavelength division multiplexer (CWDM). The photonic integrated circuit 702 can include a first laser to emit first light at a first wavelength, a first modulator to impart a first data signal onto the first light, a second laser to emit second light at a second wavelength, a second modulator to impart a second data signal onto the second light, a multiplexer to combine the modulated first and second lights into output light, and a first coupler to couple the output light out of the photonic integrated circuit 702 into an optical fiber. The photonic integrated circuit 702 can include additional lasers and modulators at additional wavelengths, as needed. As standardized data rates increase over time, the modulators can be run at faster rates, so that the same platform can be used with successive generations of the photonic integrated circuit 702. Similarly, as channel counts (e.g., the number of wavelengths present in the output light) increase over time, the number of additional lasers and modulators at additional wavelengths can be increased, as needed.

As another example, the photonic integrated circuit 702 can be configured to operate in parallel single mode. The photonic integrated circuit 702 can include a first laser to emit first light at a first wavelength, a first modulator to impart a first data signal onto the first light, a first coupler to couple the modulated first light out of the photonic integrated circuit 702 into a first optical fiber, a second laser to emit second light at a second wavelength, a second modulator to impart a second data signal onto the second light, and a second coupler to couple the modulated second light out of the photonic integrated circuit 702 into a second optical fiber. The photonic integrated circuit 702 can include additional lasers, modulators, and couplers at additional wavelengths, as needed.

The optical transceiver 700 can include a control ASIC 706, which can control the photonic integrated circuit 702. The control ASIC 706 can optionally accommodate both electrical and optical signals.

The optical transceiver 700 can include a microcontroller 708, which can control which chips communicate with each other. In some examples, the microcontroller 708 can include an I-squared-C management interface, which is a synchronous, multi-master, multi-slave, packet switched, single-ended, serial computer bus. Other interfaces can also be used.

The optical transceiver 700 can include a chipset 710, which can correspond to a number of data channels and a data rate. In some examples, the chipset 710 can have integrated retimers.

The optical transceiver 700 can include a substrate 712, which mechanically supports all the elements of the optical transceiver 700. In some examples, the substrate 712 can conform to a standardized size and configuration, such as a 14 mm by 14 mm ball grid array configuration. Other configurations can also be used.

Having described different aspects and features of NIPDs with self-test functionality, as well as of optical transceivers in which they may be used, the following numbered examples are provided as illustrative embodiments:

1. A normal incidence photodetector structure comprising: a p-i-n mesa disposed on a semiconductor-on-insulator (SOI) substrate, the p-i-n mesa comprising n-type, active, and p-type semiconductor layers; metal contacts contacting the p-type and n-type semiconductor layers; and a waveguide formed in a semiconductor device layer of the SOI substrate and configured to operatively couple light into the p-i-n mesa.

2. The photodetector structure of example 1, wherein the waveguide flares out from a width smaller than half of a diameter of the p-i-n mesa to a strip underneath the p-i-n mesa dimensioned and positioned to encompass at least half the diameter of the p-i-n mesa, the strip operatively to couple light through a bottom surface of the p-i-n mesa into the p-i-n mesa.

3. The photodetector structure of example 1, wherein the waveguide comprises a wrap-around portion formed along and underneath an edge of the p-i-n mesa to operatively couple light at least one of directly into the p-i-n mesa or into a semiconductor structure formed in the semiconductor device layer underneath the p-i-n mesa.

4. The photodetector structure of example 3, wherein the portion of the waveguide formed along and underneath the edge of the p-i-n mesa tapers down to a narrower width at a terminal end of the waveguide.

5. The photodetector structure of example 3 or example 4, wherein the semiconductor device layer is at least partially etched down in a region underneath the p-i-n mesa surrounded by the wrap-around portion of the waveguide.

6. The photodetector structure of example 3 or example 4, wherein the semiconductor device layer is left unetched in a region underneath the p-i-n mesa surrounded by the wrap-around portion of the waveguide.

7. The photodetector structure of example 3 or example 4, wherein the semiconductor device layer is patterned in accordance with a fill pattern in a region underneath the p-i-n mesa surrounded by the wrap-around portion of the waveguide.

8. The photodetector structure of any of examples 1-7, wherein the layers in the p-i-n mesa are arranged with an n-type layer closest to the SOI substrate, the active layer on top of the one or more n-type layers, and one or more p-type layers on top of the active layer, and wherein the one or more p-type layers comprise at least a p-type contact layer.

9. The photodetector structure of example 8, wherein the p-type contact layer is uniform.

10. The photodetector structure of example 8, wherein the p-type contact layer is ring-shaped.

11. The photodetector structure of any of examples 1-10, wherein the p-i-n mesa is made from III-V materials.

12. An optical transceiver integrated on a semiconductor substrate, the optical transceiver comprising: one or more optical transmitters formed at least in part in a device layer of the substrate; a transmitter output port; one or more optical receivers each comprising a normal incidence photodetector formed on the substrate by a p-i-n mesa with electrical connections, and a waveguide formed in a device layer of the substrate and configured to couple light into the p-i-n mesa; and an optical switch configured to selectively couple the one or more optical transmitters either to the transmitter output port in a normal operation mode or to the waveguides of the one or more optical receivers in a self-test mode.

13. The optical transceiver of example 12, comprising multiple optical transmitters and multiple respective optical receivers configured for multiple respective operating wavelengths, wherein the optical switch comprises a wavelength multiplexer further configured to multiplex optical signals received from the multiple optical transmitters.

14. The optical transceiver of example 12 or example 13, wherein the waveguide of at least one of the optical receivers flares out from a width smaller than half of a diameter of the p-i-n mesa to a strip underneath the p-i-n mesa dimensioned and positioned to encompass at least half the diameter of the p-i-n mesa, the strip operatively to couple light through a bottom surface of the p-i-n mesa into the p-i-n mesa.

15. The optical transceiver of example 12 or example 13, wherein the waveguide comprises a wrap-around portion formed along and underneath an edge of the p-i-n disk to operatively couple light at least one of directly into the p-i-n mesa or into a semiconductor structure formed in the semiconductor device layer underneath the p-i-n mesa.

16. A method of testing an optical transceiver comprising an optical transmitter and an optical receiver, the optical receiver comprising a normal incidence photodetector (NIPD) and an associated waveguide structure configured to couple in-plane light into the NIPD, the method comprising: generating an optical signal with the optical transmitter; selectively coupling an output of the optical transmitter to the waveguide structure associated with the NIPD, whereby the optical signal is coupled into the NIPD; and measuring a photocurrent at the NIPD to determine a responsivity of the receiver.

17. The method of example 16, further comprising: modulating the optical signal to impart high-speed data on the optical signal; and determining at least one of a bandwidth, a packet loss, or a bit error rate of data received at the optical receiver.

18. The method of example 16 or example 17, wherein the optical transmitter comprises a transmitter laser and a transmitter modulator and the optical transceiver further comprises a multiplexer; wherein the method further comprises calibrating a wavelength of the transmitter laser, measuring an output power of the transmitter laser, measuring an output power of the transmitter modulator, and measuring an output power of the multiplexer; and wherein the responsivity of the NIPD is determined based on the measured photocurrent and the measured output power of the multiplexer.

19. The method of any one of examples 16-18, wherein the waveguide structure flares out from a width smaller than half a diameter of the NIPD to a strip underneath the NIPD that encompasses at least half the diameter of the NIPD, and wherein the optical signal is coupled vertically from the strip into the NIPD.

20. The method of any one of examples 16-18, wherein the waveguide structure comprises a wrap-around portion formed along and underneath an edge of the NIPD, and wherein the optical signal is coupled at least one of directly into the NIPD or into a semiconductor structure formed in a layer underneath the NIPD.

Although the inventive subject matter has been described with reference to specific example embodiments, it will be evident that various modifications and changes may be made to these embodiments without departing from the broader spirit and scope of the inventive subject matter. Accordingly, the specification and drawings are to be regarded in an illustrative rather than a restrictive sense.

What is claimed is:

1. A photodetector structure comprising:
   a circular, oval, or square-shaped p-i-n mesa bonded to a semiconductor device layer of a semiconductor-on-insulator (SOI) substrate comprising the semiconductor device layer on top of an insulating undercladding, the p-i-n mesa comprising n-type, active, and p-type semiconductor layers;
   metal contacts contacting the p-type and n-type semiconductor layers; and
   a semiconductor waveguide formed in the semiconductor device layer of the SOI substrate and configured to operatively couple light into the p-i-n mesa.

2. The photodetector structure of claim 1, wherein the waveguide flares out from a width smaller than half of a diameter of the p-i-n mesa to a strip underneath the p-i-n mesa dimensioned and positioned to encompass at least half the diameter of the p-i-n mesa, the strip operatively to couple light through a bottom surface of the p-i-n mesa into the p-i-n mesa.

3. The photodetector structure of claim 1, wherein the waveguide comprises a wrap-around portion formed along and underneath an edge of the p-i-n mesa to operatively couple light at least one of directly into the p-i-n mesa or into a semiconductor structure formed in the semiconductor device layer underneath the p-i-n mesa.

4. The photodetector structure of claim 3, wherein the portion of the waveguide formed along and underneath the edge of the p-i-n mesa tapers down to a narrower width at a terminal end of the waveguide.

5. The photodetector structure of claim 3, wherein the semiconductor device layer is at least partially etched down in a region underneath the p-i-n mesa surrounded by the wrap-around portion of the waveguide.

6. The photodetector structure of claim 3, wherein the semiconductor device layer is left unetched in a region underneath the p-i-n mesa surrounded by the wrap-around portion of the waveguide.

7. The photodetector structure of claim 3, wherein the semiconductor device layer is patterned in accordance with a fill pattern in a region underneath the p-i-n mesa surrounded by the wrap-around portion of the waveguide.

8. The photodetector structure of claim 1, wherein the p-i-n mesa is made from III-V materials, and wherein the semiconductor device layer and the semiconductor waveguide are made of silicon.

9. An optical transceiver integrated on a semiconductor substrate, the optical transceiver comprising:
   one or more optical transmitters formed at least in part in a device layer of the substrate;
   one or more optical receivers each comprising a photodetector formed on the substrate by a p-i-n mesa with electrical connections, and a waveguide formed in a device layer of the substrate and configured to couple light into the p-i-n mesa; and
   an optical switch configured to selectively either enable or disable a self-test mode, wherein enabling the self-test mode comprises coupling the one or more optical transmitters to the waveguides of the one or more optical receivers.

10. The optical transceiver of claim 9, comprising multiple optical transmitters and multiple respective optical receivers configured for multiple respective operating wavelengths, wherein the optical switch comprises a wavelength multiplexer further configured to multiplex optical signals received from the multiple optical transmitters.

11. The optical transceiver of claim 9, wherein the optical switch is configured to selectively enable or disable the self-test mode by selectively focusing an optical signal onto one of two outputs of the optical switch, wherein an output, of the two outputs, that is associated with the self-test mode optically connects the optical switch to the receivers.

12. The optical transceiver of claim 11, wherein the optical switch comprises an active tuning element configured to change optical path lengths of the optical signal to perform the focusing.

13. The optical transceiver of claim 9, wherein the optical switch comprises a Mach-Zehnder modulator.

14. The optical transceiver of claim 9, wherein the waveguide of at least one of the optical receivers flares out from a width smaller than half of a diameter of the p-i-n mesa to a strip underneath the p-i-n mesa dimensioned and positioned to encompass at least half the diameter of the p-i-n mesa, the strip operatively to couple light through a bottom surface of the p-i-n mesa into the p-i-n mesa.

15. The optical transceiver of claim 9, wherein the waveguide comprises a wrap-around portion formed along and underneath an edge of the p-i-n mesa to operatively couple light at least one of directly into the p-i-n mesa or into a semiconductor structure formed in the semiconductor device layer underneath the p-i-n mesa.

16. The optical transceiver of claim 9, wherein the photodetector is a normal-incidence photodetector.

17. The optical transceiver of claim 9, wherein the p-i-n mesa is circular, oval, or square-shaped.

18. A method of testing an optical transceiver comprising an optical transmitter and an optical receiver integrated on a single substrate comprising a semiconductor device layer on top of an insulating undercladding, the optical receiver comprising a normal incidence photodetector (NIPD) bonded to the semiconductor device layer of the substrate and an associated waveguide structure formed in the semiconductor device layer of the substrate underneath the NIPD and configured to couple in-plane light into the NIPD, the method comprising:
    generating a modulated optical signal with the optical transmitter, the modulated optical signal carrying high-speed data;
    selectively coupling an output of the optical transmitter to the waveguide structure associated with the NIPD, whereby the optical signal is coupled vertically into the NIPD; and
    measuring a photocurrent at the NIPD to determine at least one of a bit error rate, a packet loss, a bandwidth, or a responsivity of the receiver.

19. The method of claim 16, wherein the waveguide structure flares out from a width smaller than half a diameter of the NIPD to a strip underneath the NIPD that encompasses at least half the diameter of the NIPD, and wherein the optical signal is coupled vertically from the strip into the NIPD.

20. The method of claim 16, wherein the waveguide structure comprises a wrap-around portion formed along and underneath an edge of the NIPD, and wherein the optical signal is coupled at least one of directly vertically into the NIPD or into a semiconductor structure formed underneath the NIPD from which the optical signal is coupled vertically into the NIPD.

\* \* \* \* \*